United States Patent
Binkhoff

(10) Patent No.: US 8,943,907 B2
(45) Date of Patent: Feb. 3, 2015

(54) METHOD AND DEVICE FOR MEASURING A MICROELECTROMECHANICAL SEMICONDUCTOR COMPONENT

(75) Inventor: Peter Binkhoff, Dortmund (DE)

(73) Assignee: ELMOS Semiconductor AG, Dortmund (DE)

( * ) Notice: Subject to any disclaimer, the term of this patent is extended or adjusted under 35 U.S.C. 154(b) by 86 days.

(21) Appl. No.: 13/990,349

(22) PCT Filed: Oct. 26, 2011

(86) PCT No.: PCT/EP2011/068722
§ 371 (c)(1),
(2), (4) Date: May 29, 2013

(87) PCT Pub. No.: WO2012/072347
PCT Pub. Date: Jun. 7, 2012

(65) Prior Publication Data
US 2013/0247688 A1    Sep. 26, 2013

(30) Foreign Application Priority Data
Dec. 3, 2010 (EP) .................................. 10193596

(51) Int. Cl.
*G01L 1/04* (2006.01)
*G01L 9/00* (2006.01)
*B81C 99/00* (2010.01)
*G01L 27/00* (2006.01)
*G01R 31/27* (2006.01)
*G01R 31/28* (2006.01)

(52) U.S. Cl.
CPC ............ *G01L 9/0098* (2013.01); *B81C 99/003* (2013.01); *B81C 99/005* (2013.01); *G01L 27/002* (2013.01); *G01R 31/275* (2013.01); *G01R 31/2887* (2013.01); *G01R 31/2891* (2013.01)
USPC .................................... 73/862.621; 73/777

(58) Field of Classification Search
USPC ....................... 73/760, 777, 862.621
See application file for complete search history.

(56) References Cited

U.S. PATENT DOCUMENTS 6,459,524 B1 * 10/2002 Zhang et al. .................. 359/290
6,472,891 B1 * 10/2002 Tran .......................... 324/756.02
7,049,838 B2 * 5/2006 Kagami .................... 324/755.04

(Continued)

OTHER PUBLICATIONS

Patil et al., "Characterization of MEMS piezoresistive pressure sensors using AFM," Ultramicroscopy 110(9):1154-1160 (2010).

*Primary Examiner* — Max Noori
(74) *Attorney, Agent, or Firm* — Dardi & Herbert, PLLC; Peter S. Dardi

(57) ABSTRACT

In the method for measuring a micromechanical semiconductor component which comprises a reversibly deformable measuring element sensitive to mechanical stresses, which is provided with electronic circuit elements and terminal pads for tapping measurement signals, the measuring element (18) of the semiconductor component (16), for the purpose of determining the distance/force and/or distance/pressure characteristic curve thereof, is increasingly deformed by mechanical action of a plunger (32) which can in particular be advanced step by step. After a or after each step-by-step advancing movement of the plunger (32) by a predetermined distance quantity, the current measurement signals are tapped via the terminal pads (24). The semiconductor component (16) is qualified on the basis of the obtained measurement signals representing the distance/force and/or distance/pressure characteristic curve.

13 Claims, 1 Drawing Sheet

(56) References Cited

U.S. PATENT DOCUMENTS

| | | | |
|---|---|---|---|
| 7,874,219 B2 * | 1/2011 | Frahnow et al. | 73/861.355 |
| 8,228,086 B2 * | 7/2012 | Lee | 324/756.02 |
| 2007/0080695 A1 | 4/2007 | Morrell et al. | |
| 2013/0263643 A1 * | 10/2013 | Binkhoff | 73/1.57 |

* cited by examiner

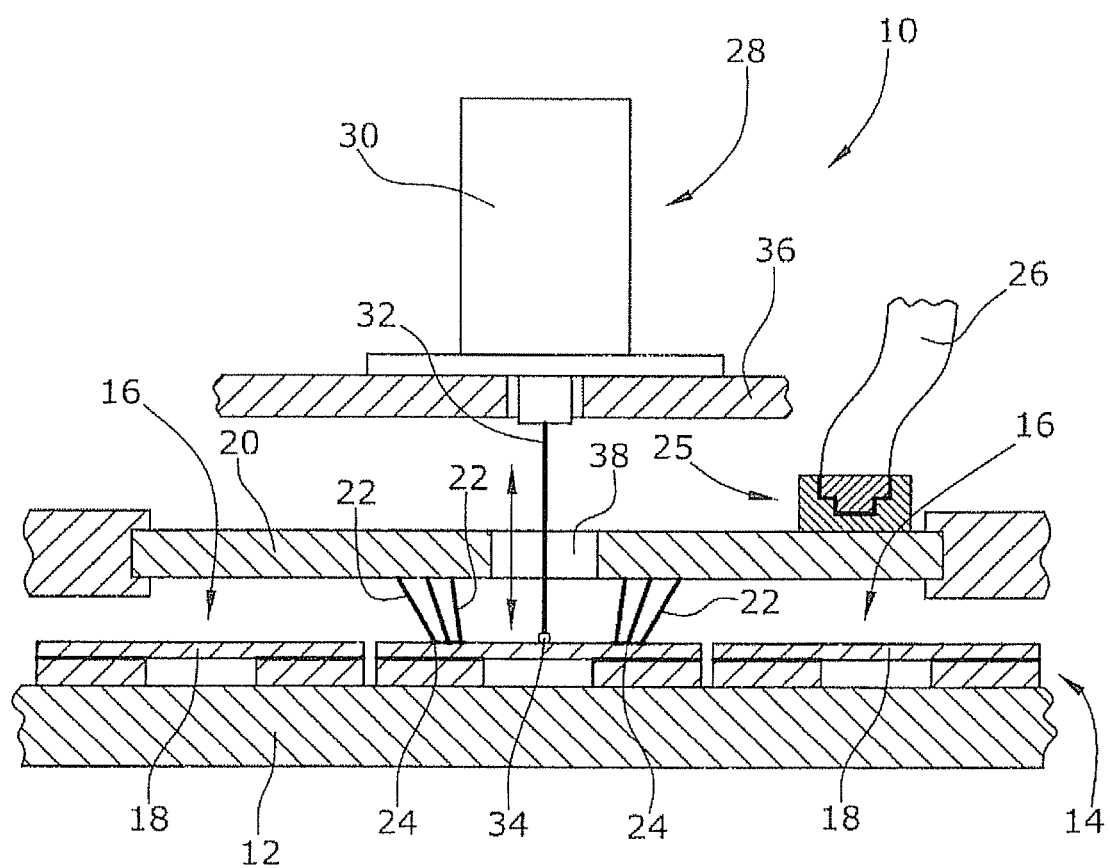

METHOD AND DEVICE FOR MEASURING A MICROELECTROMECHANICAL SEMICONDUCTOR COMPONENT

CROSS REFERENCE TO RELATED APPLICATIONS

This application is a national stage filing of PCT application number PCT/EP2011/068722 filed on Oct. 26, 2011, which claims priority to European patent application number 10193596.3 filed on Dec. 3, 2010, both of which are incorporated herein by reference.

The invention relates to a method and a device for measuring a microelectromechanical semiconductor component which comprises a reversibly deformable pressure-sensitive measuring element and electronic circuit elements as well as terminal pads for tapping measurement signals.

Microelectromechanical semiconductor components are microcomponents of semiconductor material having both mechanical and electrical functions. Thus these semiconductor components comprise movable and/or deformable elements which may serve for the metrological detection of physical variables, for example. A group of microelectromechanical semiconductor components comprises pressure sensors, for example, which include a reversibly deformable pressure-sensitive measuring element mostly in the form of a membrane. Besides such a (e. g. measuring) element the semiconductor components comprise electronic circuit elements as well as evaluation circuits and terminal pads for tapping measurement signals, if required. In the case of a pressure sensor the circuit elements comprise such elements which detect the mechanical stresses occurring during deformation of the measuring elements. These circuit elements are pressure-sensitive transistors or resistors, for example, which are integrated in the measuring element and are arranged in a bridge circuit, for example.

Microelectromechanical semiconductor components are produced, like integrated semiconductor circuits, on a semiconductor substrate wafer. These wafers are subjected to a wafer test in a so-called wafer prober; during the test of the microelectromechanical semiconductor components the latter are thus not yet separated. It is common practice to test not only the electrical but also the mechanical functions of the microelectromechanical semiconductor components during the wafer test. In the case of pressure sensors a dynamic pressure method is applied, for example, wherein an air flow is blown on the semiconductor component to be tested. Further, it is common practice to arrange a pressure chamber above the wafer and then to test the wafer in this atmospheric environment inside the wafer prober test assembly. Finally, the wafer prober assembly may also be completely placed in a pressure chamber for testing the pressure sensors on the wafer. In all aforementioned cases the pressure applied from outside causes a deflection of the reversibly deformable measuring element proportionally to the applied pressure.

From Patil S K et al.: "Characterization of MEMS piezoresistive pressure sensors using AFM", ULTRAMICROSCOPY, ELSEVIER, AMSTERDAM, NL, vol. 110, no. 9, Aug. 1, 2010 (2010 Aug. 1), pages 1154-1160, XP027174554, ISSN: 0304-3991 a test method for MEMS pressure sensors is known, wherein a plunger mechanically acts upon the pressure-sensitive measuring element at a predeterminable force and the measurement signal supplied by the pressure sensor is evaluated. In this case a force sensor for the plunger is required which involves further hardware costs and requires calibration of the force sensor.

US-A-2007/0080695 describes a test assembly as well as a test method for capacitive MEMS sensors having a movable (capacitor) plate which is mechanically moved.

The known test methods for microelectromechanical semiconductor components are relatively complex and require a wafer prober test assembly substantially modified with regard to the equipment as compared with integrated circuits. Further, they are subject to restrictions with regard to the pressure range and/or the test setups for various thicknesses of the pressure-sensitive measuring elements must be of different configurations.

It is an object of the invention to provide a method and a device for measuring a microelectromechanical semiconductor component, said method and device comprising a simplified equipment setup.

According to the invention, this object is achieved with a method for measuring a microelectromechanical semiconductor component comprising a reversibly deformable measuring element sensitive to mechanical stresses and is provided with electronic circuit elements as well as terminal pads for tapping measurement signals, wherein in the method the measuring element of the semiconductor component, for the purpose of determining the distance/force and/or distance/pressure characteristic curve thereof, is increasingly deformed by mechanical action of a plunger which can in particular be advanced step by step, after a or after each step-by-step advancing movement of the plunger by a predetermined distance quantity, the current measurement signals are tapped via the terminal pads, and the semiconductor component is qualified on the basis of the obtained measurement signals representing the distance/force and/or distance/pressure characteristic curve.

The invention further provides a device for measuring a microelectromechanical semiconductor component which comprises a reversibly deformable measuring element sensitive to mechanical stresses and is provided with electronic circuit elements as well as terminal pads for tapping measurement signals, said device including a plurality of electric test needles for electrically contacting the terminal pads of the semiconductor component, a plunger adapted to be moved forward and backward for mechanically contacting the measuring element, and an actuator for moving the plunger in particular step by step by a respective predetermined distance quantity to increasingly deform the measuring element.

According to the invention, the measuring element sensitive to mechanical stresses, which is a pressure-sensitive measuring element, for example, is deformed by mechanical action of a plunger which can be advanced step by step, said plunger in particular being a needle. After a and/or after each defined step-by-step advance of the plunger the current measurement signals are tapped via the terminal pads. Thus the characteristic of the measuring element can be determined and the semiconductor component as a whole can be qualified. Further, by means of the method according to the invention and the device according to the invention, respectively, the reversible deformation of the measuring element can be effected in a space-resolved manner, as seen across the geometry of the measuring element, by subjecting the measuring element to the mechanical action of the plunger at different places in several test runs. The measuring element may be a deformable element (membrane) connected to a substrate on four sides or have a triple, double (bridge) or single (cantilever beam) connection, for example. The deformation can be detected by means of an in particular piezo-resistive transistor or resistor sensitive to mechanical stresses.

Instead of being advanced step by step, the plunger may be continuously moved, for example, wherein the measurement signals are evaluated during deformation of the measuring element at predeterminable time intervals, i. e. after respective defined varyingly strong deflections of the measuring element. In this manner, too, the characteristic of the microelectromechanical semiconductor component can be measured and qualified. Further, a continuous deformation of the measuring element allows the dynamics of the latter to be metrologically detected, wherein for this purpose the velocity at which the plunger is advanced can be changed. However, the latter is also possible during step-by-step advance of the plunger.

As a drive unit for the step-by-step advance of the plunger a piezo-linear motor is suitable, for example; generally any step motor or any other motor or generally any electromechanical actuator or any actuator operating in any other physical manner which allows a reproducible step-by-step advance to be realized can be used.

As mentioned above, the plunger may be configured as a needle. A wafer prober, too, uses (scanning or tapping) needles with the aid of which the terminal pads of a semiconductor circuit are tapped. The method according to the invention can thus be integrated into a wafer prober. The needle deflecting the reversibly deformable measuring element is made of ceramic, glass fiber, plastic material, tungsten or any other material. The point of the plunger and/or the needle contacting the measuring element should be rounded.

The invention allows microelectromechanical semiconductor components (pressure sensors, for example) to be checked with regard to their linearity, their sensitivity, their temperature dependence, their reversibility, with regard to their hysteresis and/or to be checked as to whether these semiconductor components include any measuring element and whether this measuring element is connected to the remaining part of the semiconductor component in a mechanically correct manner. Generally, the invention allows the characteristic of a microelectromechanical semiconductor component to be determined and the semiconductor component to be mechanically measured. In the invention it is decisive that not the force at which the measuring element is deformed by the plunger is predetermined but the distance by which the measuring element is deflected and thus deformed by the plunger, and hence the distance/force characteristic curve and/or, by conversion, the distance/pressure characteristic curve of the MEMS sensor is measured and selected for the purpose of qualifying the component.

As mentioned above, the microelectromechanical semiconductor component may be a pressure sensor. However, a microelectromechanical semiconductor component to be measured according to the invention can also be used as an acceleration sensor or a viscosity sensor. Basically, the invention can be used for checking any microelectromechanical semiconductor component in any conceivable application.

Hereunder the invention is explained in detail with reference to the drawing (FIG. 1).

The drawing schematically illustrates the test setup for a wafer prober 10 comprising a carrier 12 for a silicon wafer 14, for example, in which a plurality of microelectromechanical semiconductor component pressure sensors 16 are configured. Each pressure sensor 16 comprises e. g. a membrane 18 as a reversibly deformable measuring element sensitive to mechanical stresses, in the present case a pressure-sensitive measuring element, for example. The wafer prober 10 further includes a carrier 20 having test needles 22 for contacting terminal pads 24 of the pressure sensors 16. Further, this carrier 20 may comprise electronic components or circuits and a terminal 25 for a cable system 26 extending to a test signal evaluation circuit, for example.

According to the invention, such a wafer prober 10 is modified by providing an actuator 28, e. g. in the form of a piezo-linear motor 30 for step-by-step or continuous forward and backward movement of a needle-shaped plunger 32 serving for mechanically deflecting the pressure sensor membranes 18. The needle-shaped plunger 32 comprises a rounded point 34 which may be configured as a microsphere, for example. For supporting the actuator 28 another carrier 36 is provided which may be arranged above the carrier 20 for the needles 22. The needle-shaped plunger 32 passes through an opening 38 of this carrier 20 and is thus arranged essentially centrically with respect to the (electric) needles 22.

Surprisingly it has turned out that despite the mechanical action on the membranes 18 by contacting the latter with the needle-shaped plunger 32 no damage affecting the functionality of the membranes 18 occurs at the pressure sensors 16 during the test according to the invention. The invention offers, inter alia, the further advantage that the same test setup can be used for various membrane thicknesses such that the test pressure range is not limited in any way. The measurement values determined at variably strong mechanical deflections of the membranes 18 can be correlated with a corresponding air pressure. Thus the semiconductor component as a whole can be qualified. During the mechanical test of the deformable element according to the invention, the latter may be subjected to the same deflections as will occur when used in practice. In particular, during the test the same conditions as prevail during the dedicated use of the component can be simulated. In conventional test methods this has hardly been possible since e.g. pressures of several 10 to 100 bars could not be realized during testing or could only be realized at extreme expenditure.

The invention claimed is:

1. A method for measuring a microelectromechanical semiconductor component comprising a reversibly deformable measuring element sensitive to mechanical stresses and is provided with electronic circuit elements as well as terminal pads for tapping measurement signals, wherein in the method said measuring element of said semiconductor component, for the purpose of determining the distance/force and/or distance/pressure characteristic curve thereof, is increasingly deformed by mechanical action of a plunger which can in particular be advanced step by step, after an advancing movement or after each step-by-step advancing movement of said plunger by a predetermined distance quantity, the current measurement signals are tapped via said terminal pads, and said semiconductor component is qualified on the basis of the obtained measurement signals representing the distance/force and/or distance/pressure characteristic curve.

2. The method according to claim 1, characterized in that a plurality of semiconductor components to be measured are configured on a substrate wafer, and that the measurement is carried out within the framework of a wafer test.

3. The method according to claim 1, characterized in that the semiconductor component is accommodated in a housing when being tested.

4. The method according to claim 3, characterized in that the measurement is carried out in a test device for testing the electronic circuit of the semiconductor component.

5. The method according to claim 4, characterized in that as the plunger a test needle having a rounded point is selected.

6. A device for measuring a microelectromechanical semiconductor component which comprises a reversibly deformable measuring element sensitive to mechanical stresses and is provided with electronic circuit elements as well as terminal pads for tapping measurement signals, said device including a plurality of electric test needles for electrically contacting said terminal pads of said semiconductor component, a plunger adapted to be moved forward and backward for mechanically contacting said measuring element, and an actuator for moving said plunger in particular step by step by a respective predetermined distance quantity to increasingly deform said measuring element.

7. The method according to claim 1, characterized in that the measurement is carried out in a test device for testing the electronic circuit of the semiconductor component.

8. The method according to claim 7, characterized in that as the plunger a test needle having a rounded point is selected.

9. The method according to claim 2, characterized in that the measurement is carried out in a test device for testing the electronic circuit of the semiconductor component.

10. The method according to claim 9, characterized in that as the plunger a test needle having a rounded point is selected.

11. The method according to claim 1, characterized in that as the plunger a test needle having a rounded point is selected.

12. The method according to claim 2, characterized in that as the plunger a test needle having a rounded point is selected.

13. The method according to claim 3, characterized in that as the plunger a test needle having a rounded point is selected.

\* \* \* \* \*